United States Patent [19]

Ingraham et al.

[11] Patent Number: 5,759,046
[45] Date of Patent: Jun. 2, 1998

[54] DENDRITIC INTERCONNECTION SYSTEM

[75] Inventors: Anthony Paul Ingraham, Endicott, N.Y.; Jaynal Abedin Molla, Chandler, Ariz.; David Brian Stone, Owego, N.Y.

[73] Assignee: International Business Machines Corporation, Armonk, N.Y.

[21] Appl. No.: 773,922

[22] Filed: Dec. 30, 1996

[51] Int. Cl.$^6$ .................................................. H01R 13/60
[52] U.S. Cl. ................................. 439/42; 439/259
[58] Field of Search ............................. 439/41, 42, 55, 439/74, 78, 259, 324

[56] References Cited

U.S. PATENT DOCUMENTS

| | | | |
|---|---|---|---|
| 4,352,061 | 9/1982 | Matrone | 439/42 X |
| 4,780,086 | 10/1988 | Jenner et al. | 439/42 |
| 4,818,238 | 4/1989 | Borg | 439/42 |
| 5,019,944 | 5/1991 | Ishii et al. | |
| 5,070,326 | 12/1991 | Yoshimoto et al. | |
| 5,119,218 | 6/1992 | Yoshimoto et al. | |
| 5,137,461 | 8/1992 | Bindra et al. | |
| 5,185,073 | 2/1993 | Bindra et al. | |
| 5,223,965 | 6/1993 | Ota et al. | |
| 5,233,461 | 8/1993 | Dorman et al. | |
| 5,313,322 | 5/1994 | Takanashi et al. | |
| 5,379,139 | 1/1995 | Sato et al. | |
| 5,479,284 | 12/1995 | Watanabe et al. | |

FOREIGN PATENT DOCUMENTS

258 314 A1  7/1988  Germany.

OTHER PUBLICATIONS

"Dendrite Strength and Adhesion Test Tool," Blizinski, et al., IBM Technical Disclosure Bulletin, vol. 38, No. 11, Nov., 1995.

"Palladium Dendrite to Tin/Lead Interlayer Interconnection for Multi-Layer Substrates," Leal et al., IBM Tech. Disclosure Bulletin, vol. 38, No. 9, Sep., 1995.

"Encapsulated Dendrite Electrical Interconnect for Surface Mount Applications," Arrowsmith, et al., IBM Technical Disclosure Bulletin, vol. 38, No. 8, Aug., 1995.

"Double-Sided, Replaceable, Dendrite-Plated Interposer for Connector Applications," Frankeny, et al., IBM Technical Disclosure Bulletin, vol. 37, No. 10, Oct., 1994.

"Pad on Solder Ball Structure which Allows for Ball Diameter Variation," Frankeny, et al., IBM Technical Disclosure Bulletin, vol. 37, No. 9, Sep., 1994.

"Interposer for Direct Chip Attach or Surface Mount Array Devices," Imken, et al., IBM Technical Disclosure Bulletin, vol. 36, No. 7, Jul., 1993.

*Primary Examiner*—Khiem Nguyen
*Attorney, Agent, or Firm*—Calfee, Halter & Griswold LLP

[57] ABSTRACT

A technique of connecting a first member having a first face to a second member having a second face utilizing dendrites is provided. Dendrites are formed on one face of the first member in a given configuration. Dendrite receiving and securing material, preferably solder, is formed on a face of the second member in a configuration confirming substantially to the given configuration of the dendrites on the one face. The first and second members are then placed in a position relative to each other with the dendrites on the one face of the first member in contact with the dendrite receiving and engaging material on the face of the second member. An airtight seal is then provided between the first and second faces surrounding the dendrites and dendrite receiving and engaging material, which forms a sealed chamber between the first and second members. Thereafter, a vacuum is pulled within the sealed chamber, thereby causing the ambient air pressure on the two members to urge the two members toward each other which will embed the dendrites in the dendrite receiving and engaging material to form interconnection therebetween. In order to enhance or improve the bond between the dendrites and the dendrite receiving and securing material, the dendrites and dendrite receiving and securing material each contain a component which can form an intermetallic compound therebetween.

22 Claims, 1 Drawing Sheet

DENDRITIC INTERCONNECTION SYSTEM

FIELD OF THE INVENTION

This invention relates generally to the interconnection of two members using dendrites for such interconnection. In more specific aspects, this invention relates to the use of dendrites for interconnecting two members which results in a secure, essentially permanent, connection. In even more specific aspects, this invention is especially useful in connecting liquid crystal flat panel displays with dendritic interconnections, which results in a permanent interconnection.

BACKGROUND INFORMATION

Dendritic interconnection technology has developed to the point where it is useful in a wide variety of applications. Dendritic connections and the forming of dendrites is described in detail in commonly assigned U.S. Pat. No. 5,137,461 to Bindra, et al. In making dendritic connections, dendrites are first grown, which dendrites typically are palladium, although other materials can be used. The dendrites are grown on one face of one of the members to be interconnected. Dendrite receiving and securing material is then formed on the face of the other member which is to be interconnected. This dendrite receiving and securing material may also be dendrites, although more typically solder is used; other non-metallic materials such as conductive epoxy can also be utilized as the dendrite receiving and securing material. The dendrites are formed in a given pattern, and the dendrite receiving and securing material is formed in a similar given pattern on a face of the other member. Force is applied urging the two members together, whereby the dendrites are forced into or pierce the dendrite receiving material to form an interconnection. Typically, mechanical pressure is used to exert the force. These connections can be either temporary or permanent. Temporary connections are useful, for example, in testing devices, whereas permanent interconnections are useful where one component is to be joined to another component for the operational functioning of the device. When the connection is to be permanent, the force should be maintained, urging the two members together to ensure the permanency of the connection; or, expressed in another way, force is maintained to assure that the connection does not unintentionally disengage. According to conventional prior art practice, this force is applied through clamping devices and may incorporate elastomers, stiffeners and mechanisms for introducing, adjusting and maintaining the force, urging the two members together. This technique generally provides good connections for cables, cards, boards, components, chips and other similar circuit components.

However, the use of clamping devices has certain limitations. For example, if a multiplicity of dendrites and dendrite receiving and securing materials are located over a large area, it is difficult to maintain an equal force at each of the dendritic connections, and this difficulty increases as the area increases. Additionally, difficulty is introduced if the main surfaces have a very thin cross-sectional area. Moreover, any requirement that the main surfaces must allow light to pass introduces a number dendrite contact problems. The principal of these problems is that where clamps are used, sufficient applied force for good contact is difficult to achieve, and, if achieved, uneven distribution of the force and out of plane distortion of the surfaces can result.

It is therefore an object of the present invention to provide a technique for dendritic interconnection wherein essentially uniform force can be applied to dendritic connections and good connections result which resist unintended disassembly.

SUMMARY OF THE INVENTION

According to the present invention, a technique of connecting a first member having a first face to a second member having a second face utilizing dendrites or dendrite technology is provided. In order to form the connection, dendrites are formed on one face of the first member in a given configuration. Preferably the dendrites are formed of palladium, although they may be formed of other materials such as nickel, copper, cobalt, iron, etc. The dendrites are formed in a given configuration on one face. Dendrite receiving and securing material is formed on a face of the second member in a configuration conforming substantially to the given configuration of the dendrites on the one face. The dendrite receiving and securing material preferably is solder, although other materials such as a second set of dendrites or even an epoxy (which would be a conductive epoxy if electrical connection is required) can be used as the dendrite receiving and securing material.

The first and second members are then placed in a position relative to each other with the dendrites on the one face of the first member in contact with the dendrite receiving and engaging material on the face of the second member. An airtight seal is then provided between the first and second faces surrounding the dendrites and dendrite receiving and engaging material, which forms a sealed chamber between the first and second members. Thereafter, a vacuum is pulled within the sealed chamber, thereby causing the ambient air pressure on the two members to urge the two members toward each other which will embed the dendrites in the dendrite receiving and engaging material to form interconnection therebetween. The device pulling the vacuum is then detached from the two members and the airtight chamber with the vacuum maintained therein is sealed to cause the air pressure to maintain a constant and continuous force on the two members, thereby ensuring continued positive engagement of the dendrites and the dendrite receiving and engaging material.

In order to enhance or improve the bond between the dendrites and the dendrite receiving and securing material and thus ensure a permanent interconnection, in one embodiment the dendrites and dendrite receiving and securing material each contain a component which can form an intermetallic compound therebetween. For example, the preferred palladium, when used as the dendrite material, will form an intermetallic compound when a lead/tin or lead/indium solder is used, or indeed any solder containing tin or indium. This will strengthen the bond between the dendrites and the dendrite receiving and securing material, thereby enhancing the reliability of a permanent bond.

DESCRIPTION OF THE PREFERRED EMBODIMENT(S)

According to the present invention, a pair of members are interconnected using dendrite technology by forming dendrites on the face of one member and dendrite receiving and securing material on the face of the other in corresponding patterns for bringing the two members together with the dendrites in contact with the dendrite receiving material to provide a gas-tight seal to define a chamber between the two members and than evacuating the chamber by means of a gas pump to thereby allow atmospheric pressure operating on opposite sides of the members to drive the dendrites into the dendrite receiving and securing material. This technology is illustrated in FIGS. 1-3 for one embodiment of the invention as used to manufacture flat panel liquid crystal displays, although this is merely one example of where it can be used, the technology being useful wherever two members need to be joined and an air-tight chamber can be defined between them.

Figure 1:
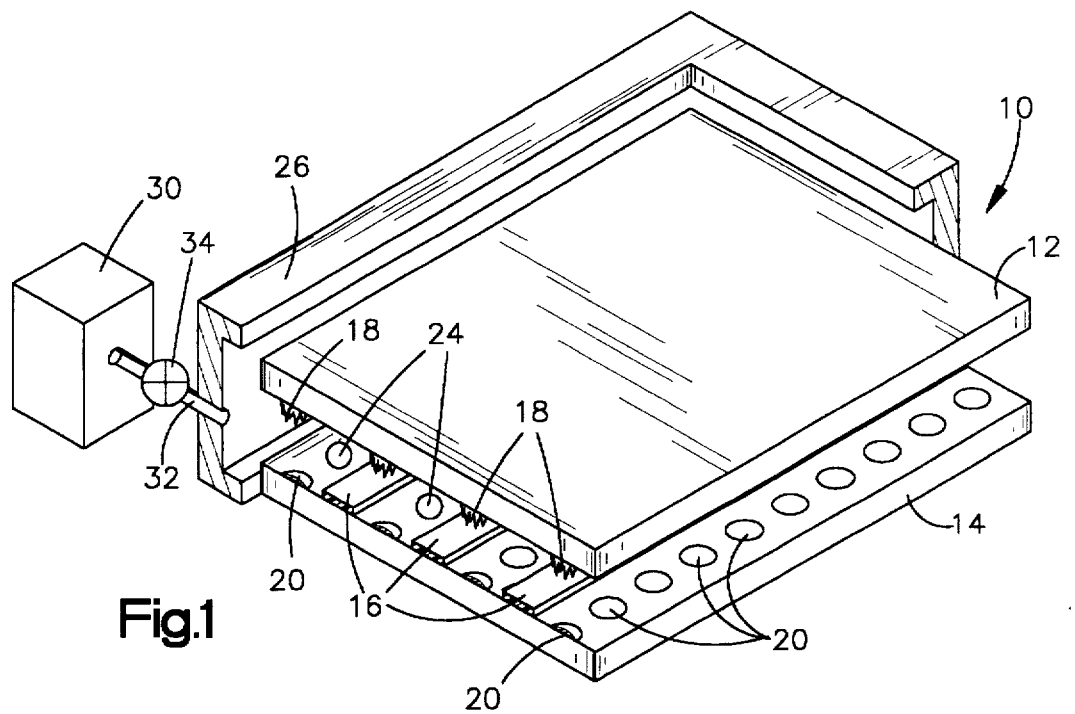
FIG. 1 is an exploded view, somewhat schematic, showing one embodiment of the present invention for use in connecting two members of a flat panel liquid display.
Figure 2:
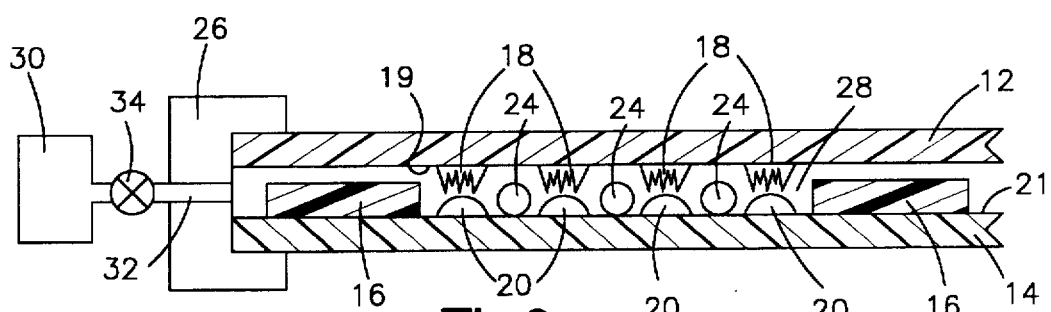
FIG. 2 is a longitudinal sectional view of the panels of FIG. 1 in position for being engaged.
Figure 3:
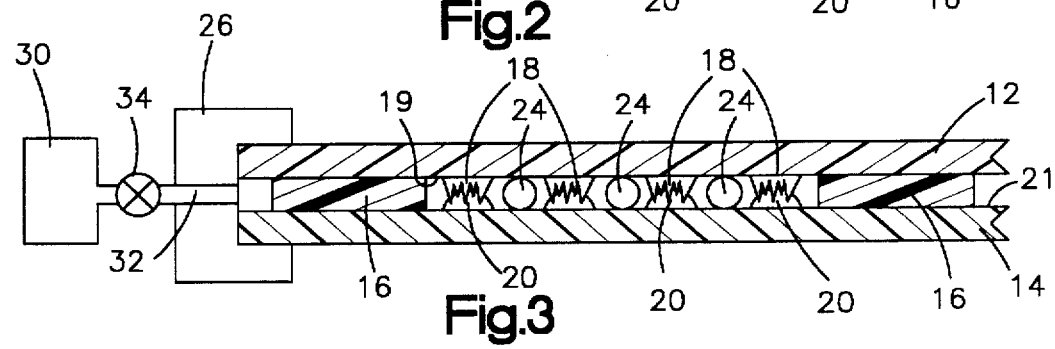
FIG. 3 is a view similar to FIG. 2 showing the two members of panels being engaged with the dendrites embedded in the dendrite receiving and engaging material and being held by vacuum.

Referring now to the drawings, and for the present to FIGS. 1-3, a flat panel LCD display is shown and designated generally by the reference character 10. The flat panel 10 is shown in an exploded view in FIG. 1 and in a longitudinal sectional view in FIG. 2 prior to forming a vacuum, and in FIG. 3 after the pulling of the vacuum. The flat panel display 10 includes an upper member 12 and a lower member 14. (As used herein, upper and lower are merely designations of the position as depicted in the drawings, it being understood that the members 12 and 14 can be utilized and/or assembled in any relative position with respect to each other.)

The flat panel 10 also includes a plurality of modules 16 containing the liquid display material which are wired together in a conventional manner (not shown) to form the LCD display and are disposed between the panels 12 and 14. The upper member 12 has dendrites 18 formed in a repeating pattern on one face 19 of the upper member 12. The dendrites preferably are formed of palladium as described in the above-entitled U.S. Pat. No. 5,137,461. However, other materials can be used to form the dendrites, such as nickel, copper, cobalt, iron or other materials which form a needle-like acicular structure which is relatively rigid and can be driven into a dendritic receiving material such as solder. A plurality of the solder bumps 20 are formed on one face 21 of the lower member 14. Solder bumps 20 are formed on the face 21 in a pattern which conforms to the pattern formed by the dendrites 18. Preferably, this solder is a lead-tin solder, although other solders, and indeed other dendrite receiving materials, can be used as will be described presently.

The upper and lower panels 12 and 14 are assembled with their faces 19 and 21 in juxtaposed relationship with the dendrites 18 contacting the solder balls 20 as shown in FIG. 2. The modules 16 are interposed between the members 12 and 14, as well as spacer balls 24. Preferably, the spacer balls are glass spheres and are used to maintain the proper spacing between the members 12 and 14 in their final operating position. Conventionally, the spacing of members 12 and 14 for an LCD display is between about 0.5 millimeters and 2 millimeters.

A gas-tight elastomeric seal, a portion of which is shown at 26, is provided surrounding the outer peripheries of the upper member 12 and lower member 14, and engaging the members 12 and 14 to provide a gas-tight chamber 28 between the faces 19 and 21 of the members 12 and 14, respectively. A particularly useful material for the seal 26 is an epoxy resin, although other materials, such as natural and synthetic rubber, could be used. The modules 16 and spacer balls 24 are disposed in this space. A vacuum pump 30 is provided which is connected by a vacuum line 32 through valve 34 to the gas-tight chamber 28. The vacuum pump is then actuated to pull a vacuum within the gas-tight chamber 28. When the chamber 28 is evacuated, the air pressure acting on the opposite sides of the upper member 12 and the lower member 14, as indicated by the arrows in FIG. 3, drives the dendrites 18 into the solder balls 20. An extremely high vacuum is not required, it being sufficient that the vacuum be high enough so that the air pressure drives the dendrites 18 into the solder balls 20 and the faces 19 and 21 of the members 12 and 14 against the tiles 16 and the spacer balls 24. A vacuum of about 1 torr is sufficient for this purpose.

By the use of a vacuum, it is possible to apply essentially uniform pressure against the entire surfaces of the members 12 and 14, causing the engagement of the dendrites 18 firmly in the solder balls 20. Such dendritic interconnection is explained fully in the above-mentioned patent, U.S. Pat. No. 5,137,461.

Once the proper vacuum has been pulled, valve 34 is shut off, and the vacuum line 32 sealed so that the vacuum is maintained in the gas-tight chamber 28, and thus the pressure maintained on the members 12 and 14 to maintain a good, tight seal.

Figure 4:
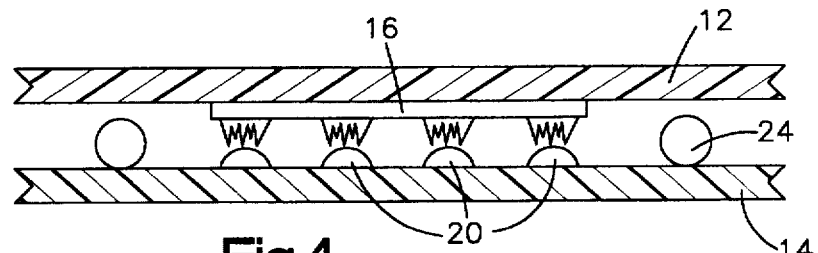
FIG. 4 is a longitudinal sectional view of another embodiment of the present invention.

Referring now to FIG. 4, another embodiment of this invention for use in flat panel liquid display is shown. This embodiment is similar to the embodiments of FIGS. 1-3, except that the dendrites 18 are grown on one face of the module 16 instead of the upper member 12. The action of the air pressure upon drawing of the vacuum is the same.

The strength of the mechanical bond between the dendrites 18 and solder 20 can be improved or enhanced by the selection of the materials for the dendrites and the solder such that an intermetallic compound can be formed. For example, if the dendrite material is palladium and the solder is a tin-containing solder, an intermetallic compound (PdSn) can be formed at the interface of the dendritic connection to the solder 20. This can be accomplished by heating the solder to above the liquidus temperature, at which point the intermetallic compound palladium-tin quickly forms, thus providing a chemical or molecular bond between the dendrites and the solder, as well as a mechanical bond. This will ensure that in case the vacuum is lost or is reduced, that there is additional strength in the joint. Indeed, in some instances, such intermetallic compound may provide a sufficiently strong bond for the permanent interconnection of certain components without a vacuum.

Other intermetallic compounds can be formed if different materials are selected for the dendrites and solder. For example, indium can be used in place of tin or in addition to tin in the solder, in which case an indium-palladium bond can be formed. Other materials such as nickel, copper, cobalt and iron can form intermetallic bonds with tin or indium.

In another embodiment, in order to form intermetallic or stronger bonds, the dendrites can be plated, such as with tin, to help in forming the intermetallic bond, or the dendrites can be plated with gold which very easily forms intermetallic bonds with various materials, including the palladium, tin and indium. In any event, by the selection of materials for the dendrites and the dendrite receiving and securing material, various intermetallic compounds can be formed by heating to strengthen the bond.

Also, it is possible to use material other than solder for forming the dendrite receiving material. For example, a second pattern of dendrites can be plated on the face 21 of the lower member 20, rather than solder, and dendrite-to-dendrite connections can be formed as described in U.S. Pat. No. 5,137,461. Again, if tin plating is used, it is possible to form intermetallic compounds which will strengthen the bond. Also, epoxy can be used in place of solder and, if electrical conductivity is required in any particular uses, conducting epoxy can be used. If an epoxy is used, formation of intermetallic compounds is not appropriate.

Accordingly, the preferred embodiment of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of connecting a first member having a first face to a second member having a second face, comprising the steps of:
   providing dendrites extending from said first face in a given configuration,
   providing dendrite receiving and engaging material on said second face in a configuration corresponding to said given configuration,
   placing said members in juxtaposed relationship with said dendrites in contact with said dendrite receiving and engaging material,
   providing an essentially air-tight seal between said first and second faces around said dendrites and dendrite receiving and engaging material to thereby form a sealed chamber between said first and second members within said air-tight seal, and
   pulling a vacuum within said sealed chamber to thereby allow said dendrites to be embedded on said dendrite receiving and engaging material to form an interconnection therebetween, and maintaining said vacuum to form a functional pair of interconnected members.

2. The invention as defined in claim 1 wherein said dendrite receiving and engaging material is solder.

3. The invention as defined in claim 1 further characterized by the provision of at least one spacer device between said first and second members within said chamber.

4. The invention as defined in claim 3 wherein there is a plurality of spacer devices between said first and second members.

5. The invention as defined in claim 1 wherein said dendrites and said dendrite receiving and engaging material each include first and second elements which form an intermetallic compound; and
   wherein after said pulling of said vacuum, said dendrites and said dendrite receiving and engaging material are heated to form said intermetallic compound.

6. The invention as defined in claim 5 wherein said dendrites include palladium.

7. The invention as defined in claim 6 wherein said dendrite receiving and engaging material includes a solder material containing tin or indium.

8. The invention as defined in claim 4 wherein said spacer devices are spherical balls.

9. The invention as defined in claim 1 wherein the vacuum is at least as low as 1 torr.

10. The invention as defined in claim 1 wherein a third member is provided which engages one of said first and second members and provides a portion of the air-tight seal, and is exposed to ambient pressure.

11. A composite structure of a first member having a first face and a second member having a second face, comprising:
    dendrites extending from said first face in a given configuration,
    dendrite receiving and engaging material on said second face in a configuration corresponding to said given configuration,
    said first and second members being in juxtaposed relationship,
    an essentially air-tight seal between said first and second faces around said dendrites and dendrite receiving and engaging material to thereby form a sealed chamber between said first and second members within said air-tight seal, and
    a vacuum within said sealed chamber; said dendrites being embedded in said dendrite receiving and engaging material and maintained therein by ambient pressure action on said first and second members to form a continuing interconnection therebetween.

12. The invention as defined in claim 11 wherein said dendrite receiving and engaging material is solder.

13. The invention as defined in claim 11 further characterized by the provision of at least one spacer device between said first and second members within said chamber.

14. The invention as defined in claim 13 wherein there is a plurality of spacer devices between said first and second members.

15. The invention as defined in claim 11 wherein said dendrites and said dendrite receiving and engaging material each include first and second elements forming an intermetallic compound between said dendrites and said dendrite receiving and engaging material.

16. The invention as defined in claim 15 wherein said dendrite includes palladium.

17. The invention as defined in claim 16 wherein said dendrite receiving and engaging material includes a solder material containing tin or indium.

18. The invention as defined in claim 14 wherein said spacer devices are spherical balls.

19. The invention as defined in claim 11 wherein the vacuum is at least as low as 1 torr.

20. A composite structure of a first member having a first face and a second member having a second face, comprising,
    dendrites extending from said first face in a given pattern into a dendrite receiving and securing material disposed on said second face, and said dendrites and said dendrite receiving material including elements forming an intermetallic compound at the interface of said dendrites and said dendrite receiving and securing material.

21. The invention as defined in claim 20 wherein said dendrites are palladium.

22. The invention as defined in claim 21 wherein said dendrite receiving material is a tin-containing solder and said intermetallic compound is PdSn.

* * * * *